US010629246B2

(12) United States Patent
Hwang

(10) Patent No.: US 10,629,246 B2
(45) Date of Patent: Apr. 21, 2020

(54) DATA OUTPUT BUFFER

(71) Applicant: SK hynix Inc., Gyeonggi-do (KR)

(72) Inventor: Jin Ha Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/166,773

(22) Filed: Oct. 22, 2018

(65) Prior Publication Data

US 2019/0279691 A1 Sep. 12, 2019

(30) Foreign Application Priority Data

Mar. 6, 2018 (KR) ........................ 10-2018-0026488

(51) Int. Cl.
| | |
|---|---|
| *G11C 7/10* | (2006.01) |
| *G11C 11/4094* | (2006.01) |
| *G11C 11/4093* | (2006.01) |
| *G11C 7/12* | (2006.01) |
| *G11C 16/26* | (2006.01) |

(52) U.S. Cl.
CPC .............. *G11C 7/1057* (2013.01); *G11C 7/12* (2013.01); *G11C 11/4093* (2013.01); *G11C 11/4094* (2013.01); *G11C 16/26* (2013.01)

(58) Field of Classification Search
CPC ....... G11C 7/1051; G11C 7/1078; G11C 7/22; G11C 7/1006; G11C 7/1072
See application file for complete search history.

(56) References Cited

U.S. PATENT DOCUMENTS

| | | | |
|---|---|---|---|
| 8,581,620 B2 | 11/2013 | Kim | |
| 9,998,121 B2 * | 6/2018 | Choi | ..................... G11C 29/028 |
| 10,304,503 B2 * | 5/2019 | Jung | ..................... G11C 7/1057 |
| 2006/0091901 A1 * | 5/2006 | Kim | ..................... G11C 7/1051 |
| | | | 326/30 |

FOREIGN PATENT DOCUMENTS

KR              101148596           5/2012

* cited by examiner

*Primary Examiner* — Pho M Luu
(74) *Attorney, Agent, or Firm* — IP & T Group LLP

(57) ABSTRACT

A data output buffer includes: a pull-up pre driver configured to output pull-up data by reversing received data, and output up-code for adjusting a swing width of the received data; a pull-down pre driver configured to output pull-down data by reversing the received data, and output a down-code for adjusting the swing width of the received data; a pull-up main driver configured to output first data having a value of logic high according to the pull-up data, and adjust a swing width of the first data according to the up-code; and a pull-down main driver configured to output second data having a value of logic low according to pull-down data, and adjust a swing width of the second data according to the down-code.

28 Claims, 6 Drawing Sheets

DATA OUTPUT BUFFER

CROSS-REFERENCE TO RELATED APPLICATION

The present application claims priority under 35 U.S.C. § 119(a) to Korean patent application number 10-2018-0026488, filed on Mar. 6, 2018, the entire disclosure of which is incorporated herein by reference in its entirety.

BACKGROUND

1. Field of Invention

Various embodiments of the present disclosure generally relate to a memory device. Particularly, the embodiments relate to a data output buffer included in the memory device.

2. Description of Related Art

A memory device may store data or output data. For example, the memory device may be configured as a volatile memory device in which stored data is lost when the power supply is interrupted, or be configured as a nonvolatile memory device in which stored data is retained even when the power supply is interrupted. The memory device may include a memory cell array for storing data, a peripheral circuit for performing various operations such as program, read, and erase operations, and a control logic for controlling the peripheral circuit.

A memory controller may control data communication between a host and the memory device.

The memory device may communicate with the memory controller through a channel. For example, a data output buffer in the peripheral circuit included in the memory device may output data read from the memory device through the channel.

SUMMARY

Embodiments provide a data output buffer capable of outputting data without increasing the capacitance of a data input/output pad.

According to an aspect of the present disclosure, there is provided a data output buffer including: a pull-up pre driver configured to output pull-up data by reversing received data, and output up-code for adjusting a swing width of the received data; a pull-down pre driver configured to output pull-down data by reversing the received data, and output a down-code for adjusting the swing width of the received data; a pull-up main driver configured to output first data having a value of logic high according to the pull-up data, and adjust a swing width of the first data according to the up-code; and a pull-down main driver configured to output second data having a value of logic low according to pull-down data, and adjust a swing width of the second data according to the down-code.

According to another aspect of the present disclosure, there is provided a data output buffer including: a sub pull-up circuit configured to include a plurality of transistors coupled in parallel to a powervoltage terminal, and perform an emphasis or de-emphasis function for data to be outputted through an input/output pad in response to a received up-code; and a main pull-up circuit configured to couple the power voltage terminal to the input/output pad through the sub pull-up circuit according to pull-up data.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. It is noted that reference to "an embodiment" does not necessarily mean only one embodiment, and different references to "an embodiment" are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
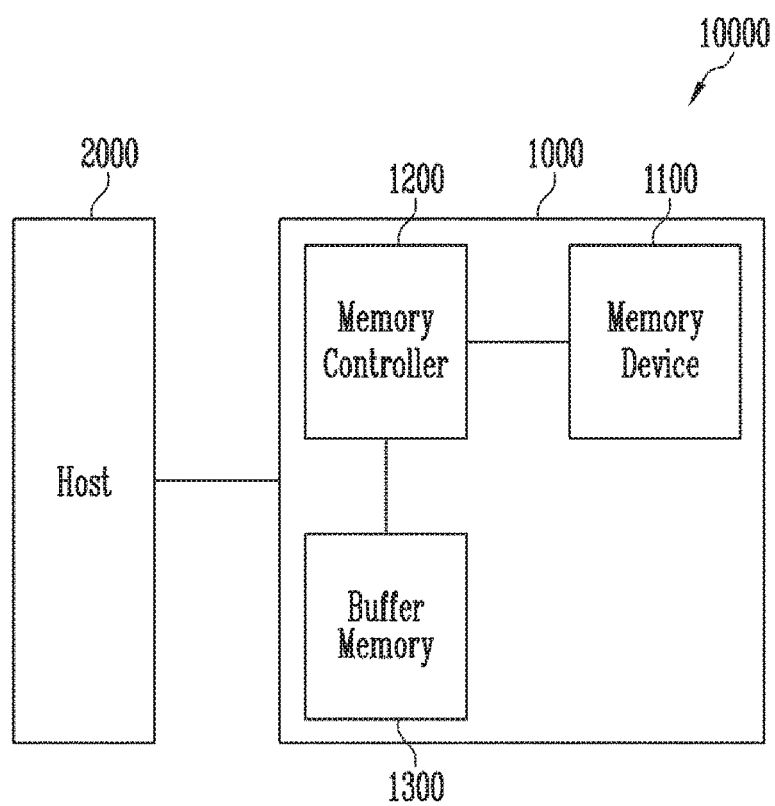
FIG. 1 is a diagram illustrating a memory system.

FIG. 1 is a diagram illustrating a memory system 1000.

Referring to FIG. 1, an electronic system 10000 may include the memory system 1000 for storing data and a host 2000 for controlling the memory system 1000.

The memory system 1000 may include a memory device 1100 for storing data, a memory controller 1200, and a buffer memory 1300 for temporarily storing data necessary for an operation of the memory system 1000. The memory controller 1200 may control the memory device 1100 and the buffer memory 1300 under the control of the host 2000.

The host 2000 may communicate with the memory system 1000, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The memory device 1100 may be implemented as a volatile memory device in which data is lost when the power supply is interrupted or a nonvolatile memory device in which data is retained even when the power supply is interrupted. The memory device 1100 may perform a program operation, a read operation or an erase operation under the control of the memory controller 1200. For example, in a program operation, the memory device 1100 may receive a command, an address, and data from the memory controller 1200, and perform the program operation. In a read operation, the memory device 1100 may receive a command and an address from the memory controller 1200, and output read data to the memory controller 1200. To this end, the memory device 1100 may include a circuit for inputting and/or outputting data.

The memory controller 1200 may control the overall operations of the memory system 1000, and control data exchange between the host 2000 and the memory device 1100. For example, the memory controller 1200 may program, read or erase data by controlling the memory device 1100 in response to a request from the host 2000. Also, the memory controller 1200 may receive data and a logical address from the host 2000, and translate the logical address into a physical address indicating an area in which data in the memory device 1100 is to be actually stored. Also, the memory controller 1200 may store, in the buffer memory 1300, a logical-to-physical address mapping table that establishes a mapping relationship between the logical address and the physical address.

The buffer memory 1300 may be used as a working memory or cache memory of the memory controller 1200, and store system data used in the memory system 1000 in addition to the above-described information. Depending on an embodiment, the buffer memory 1300 may include, for example, a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), etc.

Figure 2:
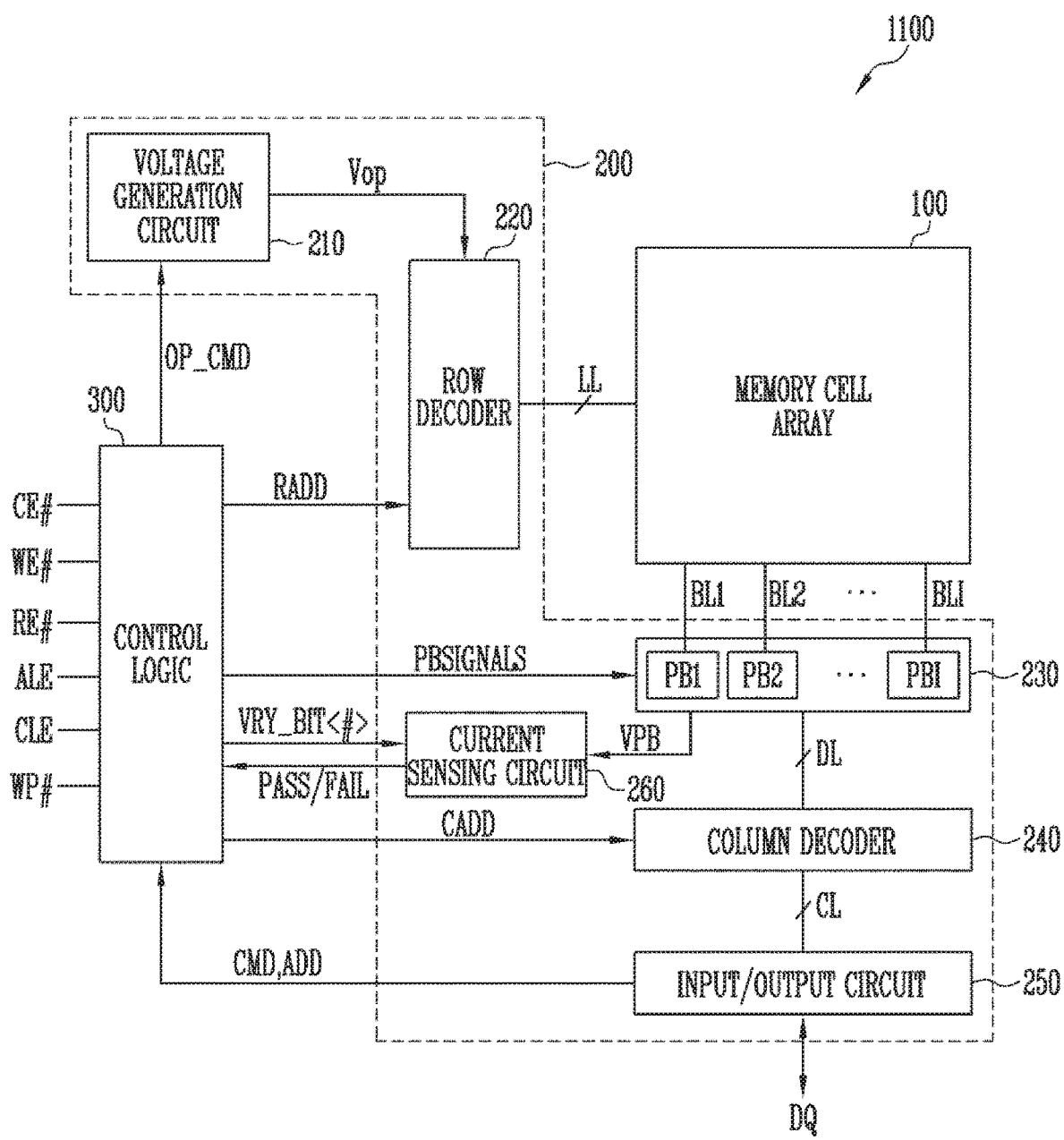
FIG. 2 is a diagram illustrating a memory device.

FIG. 2 is a diagram illustrating a memory system, for example, the memory device 1100 of FIG. 1.

Referring to FIG. 2, the memory device 1100 may be implemented as a volatile memory device or a nonvolatile memory device. In FIG. 2, a nonvolatile memory device is illustrated as an example, but this embodiment is not limited to the nonvolatile memory device.

The memory device 1100 may include a memory cell array 100 that stores data. The memory device 1100 may include a peripheral circuit 200 configured to perform a program operation for storing data in the memory cell array 100, a read operation for outputting the stored data, and an erase operation for erasing the stored data. The memory device 1100 may include a control logic 300 that controls the peripheral circuit 200 under the control of a memory controller, for example, the memory controller 1200 of FIG. 1.

The memory cell array 100 may include a plurality of memory blocks. User data and various information necessary for an operation of the memory device 1100 may be stored in the memory blocks. The memory blocks may be implemented in a two-dimensional or three-dimensional structure. Recently, memory blocks having a three-dimensional structure have been mainly used so as to improve the degree of integration. Memory blocks having the two-dimensional structure may include memory cells arranged in parallel to a substrate, and memory blocks having the three-dimensional structure may include memory cells stacked vertically to a substrate.

The peripheral circuit 200 may be configured to perform program, read, and erase operations under the control of the control logic 300. For example, the peripheral circuit 200 may include a voltage generation circuit 210, a row decoder 220, a page buffer group 230, a column decoder 240, an input/output circuit 250, and a current sensing circuit 260.

The voltage generation circuit 210 may generate various operating voltages Vop used for program, read, and erase operations in response to an operation signal OP_CMD received from the control logic 300. For example, the voltage generation circuit 210 may generate a program voltage, a verify voltage, a pass voltage, a read voltage, an erase voltage, and the like under the control of the control logic 300.

The row decoder 220 may transfer the operating voltages Vop to local lines LL coupled to a selected memory block among the memory blocks of the memory cell array 100 in response to a row address RADD. The local lines LL may include local word lines, local drain select lines, and local source select lines. In addition, the local lines LL may include various lines such as a source line, which are coupled to the memory block.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI. The page buffers PB1 to PBI may operate in response to page buffer control signals PBSIGNALS. For example, the page buffers PB1 to PBI may temporarily store data received through the bit lines BL1 to BLI, or sense voltages or currents of the bit lines BL1 to BLI in a read or verify operation.

The column decoder 240 may transfer data between the input/output circuit 250 and the page buffer group 230 in response to a column address CADD. For example, the column decoder 240 may exchange data with the page buffers PB1 to PBI through data lines DL, or exchange data with the input/output circuit 250 through column lines CL.

The input/output circuit 250 may receive a command CMD, an address ADD, and data DATA from a memory controller, for example, the memory controller 1200 of FIG. 1 through an input/output pad DQ. The input/output circuit 250 may output read data to the memory controller 1200 through the input/output pad DQ. For example, the input/output circuit 250 may transfer the command CMD and the address ADD, which are received from the memory controller 1200, to the control logic 300, or exchange the data DATA with the column decoder 240.

In a read operation or a verify operation, the current sensing circuit 260 may generate a reference current in response to a permission bit VRY_BIT<#>. The current sensing circuit 260 may output a pass signal PASS or a fail signal FAIL by comparing a sensing voltage VPB received from the page buffer group 230 with a reference voltage generated by the reference current.

The control logic 300 may receive the command CMD and the address ADD in response to signals received through CE #, WE #, RE #, ALE, CLE, ad WP # pads. The control logic 300 may control the peripheral circuit 200 by outputting the operation signal OP_CMD, the row address RADD, the page buffer control signals PBSIGNALS, and the permission bit VRY_BIT<#> in response to the command CMD and the address ADD. The control logic 300 may determine whether the verify operation has passed or failed in response to the pass or fail signal PASS or FAIL.

Figure 3:
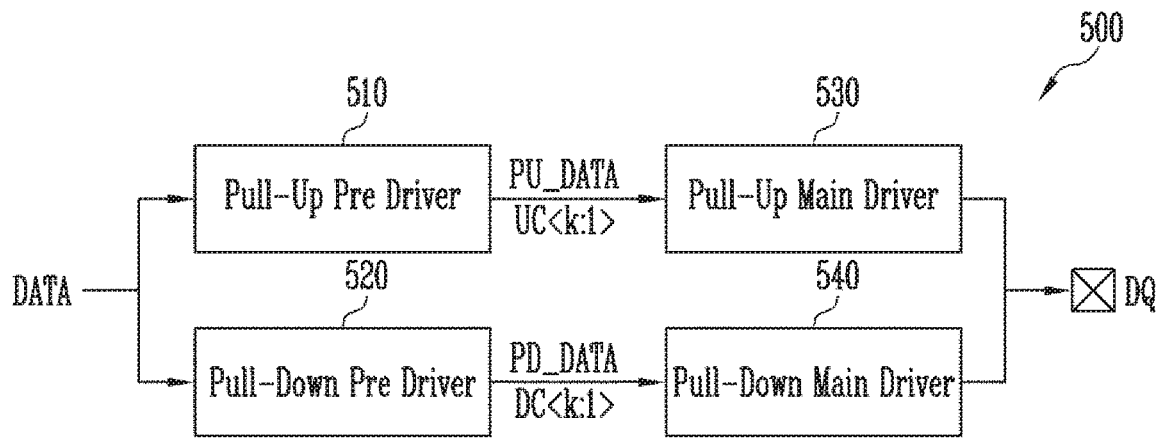
FIG. 3 is a diagram illustrating a data output buffer according to an embodiment of the present disclosure.

FIG. 3 is a diagram illustrating a data output buffer 500 according to an embodiment of the present disclosure.

Referring to FIG. 3, the data output buffer 500 may output data to an input/output pad DQ. The data output buffer 500 may be included in the input/output circuit 250.

The data output buffer 500 may amplify data DATA received through column lines, for example, the column lines CL of FIG. 2 and output the data DATA through the input/output pad DQ. To this end, the data output buffer 500 may include a pull-up pre-driver 510, a pull-down pre-driver 520, a pull-up main driver 530, and a pull-down main driver 540.

The pull-up pre-driver 510 may output pull-up data PU_DATA and an up-code UC<k:1> according to the received data DATA. The pull-up data PU_DATA may be output as a reverse data of the received data DATA, and be output by reflecting the swing width of the received data DATA as it is. For example, the pull-up pre-driver 510 may output low pull-up data PU_DATA when the received data DATA is high, and output high pull-up data PU_DATA when the received data DATA is low.

In addition, when the voltage level of the received data DATA is low, the voltage level of the pull-up data PU_DATA output from the pull-up pre-driver 510 may also be low. The up-code UC<k:1> may include a code for compensating for the pull-up data PU_DATA according to the receive data DATA. For example, a code for increasing the swing width of the received data DATA may be output when the swing width is smaller than a reference width, while a code for decreasing the swing width of the received data DATA may be output when the swing width is larger than the reference width.

The up-code UC<k:1> may be configured with a combination of bits having a value of logic '0' (hereinafter '0' bits) and bits having a value of logic '1' (hereinafter '1' bits), be configured with only '0' bits or be configured with only '1' bits, according to the received data DATA. For example, when low pull-up data PU_DATA is output, the pull-up pre-driver 510 may output the up-code UC<k:1> including at least one '0' bit. The '0' bit means a signal having a logic low, and the '1' bit means a signal having a logic high.

The pull-down pre-driver 520 may output pull-down data PD_DATA and a down-code DC<k:1> according to the received data DATA. The pull-down data PD_DATA may be output as reverse data of the received data DATA, and be output by reflecting the swing width of the received data DATA as it is. For example, the pull-down pre-driver 520 may output high pull-down data PD_DATA when the received data DATA is is low, and output low pull-down data PD_DATA when the received data DATA is high.

In addition, when the voltage level of the received data DATA is low, the voltage level of the pull-down data PD_DATA output from the pull-down pre-driver 520 may also be low. The down-code DC<k:1> may include a code for compensating for the pull-down data PD_DATA according to the received data DATA. For example, a code for increasing the swing width of the received data DATA may be output when the swing width is smaller than the reference width, while a code for decreasing the swing width of the received data DATA may be output when the swing width is larger than the reference width.

The down-code DC<k:1> may be configured with a combination of '0' and '1' bits, be configured with only '0' bits or be configured with only '1' bits, according to the received data DATA. For example, when high pull-down data PD_DATA is output, the pull-down pre-driver 520 may output the down-code DC<k:1> including at least one '1' bit.

The pull-up main driver 530 may output high data (i.e., data having a value of logic high as first data) to the input/output pad DQ in response to the pull-up data PU_DATA and the up-code UC<k:1>. For example, when low pull-up data PU_DATA is received, the pull-up main driver 530 may output high data to the input/output pad DQ. For example, when high pull-up data PU_DATA is received, the pull-up main driver 530 does not output data. That is, when the pull-up main driver 530 does not output data, an output node of the pull-up main driver 530 may be floated.

The pull-down main driver 540 may output low data (i.e., data having a value of logic low as second data) to the input/output pad DQ in response to the pull-down data PD_DATA and the down-code DC<k:1>. For example, when high pull-down data PD_DATA is received, the pull-down main driver 540 may output low data to the input/output pad DQ. For example, when low pull-down data PD_DATA is received, the pull-down main driver 540 does not output data. That is, when the pull-down main driver 540 does not output data, an output node of the pull-down main driver 540 may be floated.

Figure 4:
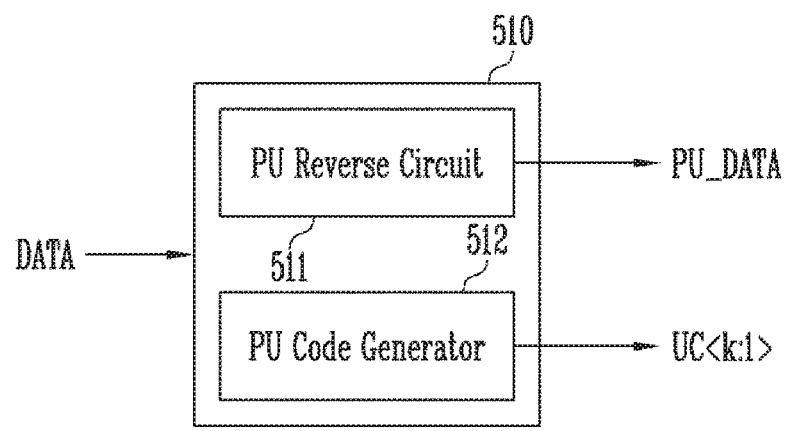
FIG. 4 is a diagram illustrating a pull-up pre-driver according to an embodiment of the present disclosure.

FIG. 4 is a diagram illustrating a pull-up pre-driver according to an embodiment of the present disclosure, for example, the pull-up pre-driver 510 of FIG. 3.

Referring to FIG. 4, the pull-up pre-driver 510 may include a pull-up (PU) reverse circuit 511 and a pull-up (PU) code generator 512.

The PU reverse circuit 511 may output pull-up data PU_DATA by reversing the received data DATA. For example, the PU reverse circuit 511 may output low pull-up data PU_DATA when high data DATA (i.e., data having a value of logic high as first data) is received, while output high pull-up data PU_DATA when low data DATA (i.e., data having a value of logic low as second data) is received. The PU reverse circuit 511 may output pull-up data PU_DATA by reflecting the swing width of the received data DATA as it is. For example, the pull-up pre-driver 510 may output low pull-up data PU_DATA when the received data DATA is high, and output high pull-up data PU_DATA when the received data DATA is low. In addition, when the voltage level of the received data DATA is low, the voltage level of the pull-up data PU_DATA output from the pull-up pre-driver 510 may also be low.

The PU code generator 512 may output an up-code UC<k:1> for compensating the pull-up data PU_DATA according to the received data DATA. For example, the PU code generator 512 may output an up-code UC<k:1> for increasing the swing width of the received data DATA when the swing width is smaller than a reference width, while output an up-code UC<k:1> for decreasing the swing width of the received data DATA when the swing width is larger than the reference width. Also, the PU code generator 512 may adjust the number of '0' and '1' bits included in the up-code UC<k:1> according to the difference between the swing width of the received data DATA and the reference width. For example, the PU code generator 512 may output the up-code UC<k:1> by combining '0' and '1' bits according to the received data DATA.

Figure 5:
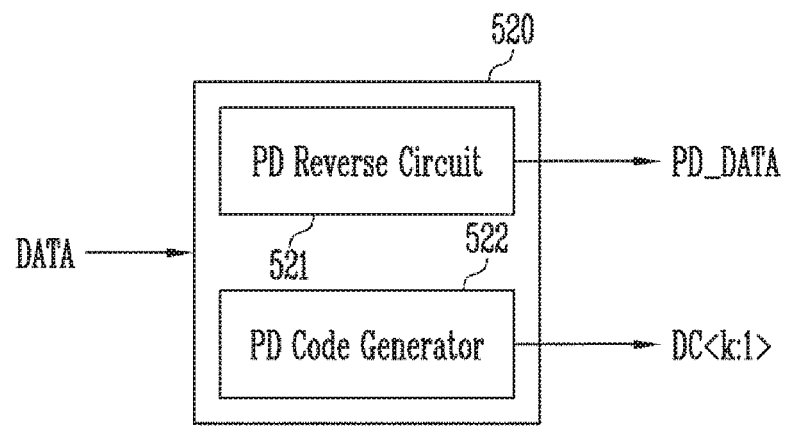
FIG. 5 is a diagram illustrating a pull-down pre-driver according to an embodiment of the present disclosure.

FIG. 5 is a diagram illustrating a pull-down pre-driver according to an embodiment of the present disclosure, for example, the pull-down pre-driver 520 of FIG. 3.

Referring to FIG. 5, the pull-down pre-driver 520 may include a pull-down (PD) reverse circuit 521 and a pull-down (PD) code generator 522.

The PD reverse circuit 521 may output pull-down data PD_DATA by reversing the received data DATA. For example, the PD reverse circuit 521 may output low pull-down data PD_DATA when high data DATA is received, while output high pull-down data PD_DATA when low data DATA is received. The PD reverse circuit 521 may output the pull-down data PD_DATA by reflecting the swing width of the received data DATA as it is. For example, the pull-down pre-driver 520 may output low pull-down data PD_DATA when the received data DATA is high, while output high pull-down data PD_DATA when the received data DATA is low. In addition, when the voltage level of the received data DATA is low, the voltage level of the pull-down data PD_DATA output from the pull-down pre-driver 520 may also be low.

The PD code generator 522 may output down-code DC<k:1> for compensating the pull-down data PD_DATA according to the received data DATA. For example, the PD code generator 522 may output a down-code DC<k:1> for increasing the swing width of the received data DATA when the swing width is smaller than the reference width, and output a down-code DC<k:1> for decreasing the swing width of the received data DATA when the swing width is larger than the reference width. In addition, the PD code generator 522 may adjust the number of '0' and '1' bits included in the down-code DC<k:1> according to the difference between the swing width of the received data DATA and the reference width. For example, the PD code generator 522 may output the down-code DC<k:1> by combining '0' and '1' bits according to the received data DATA.

Figure 6:
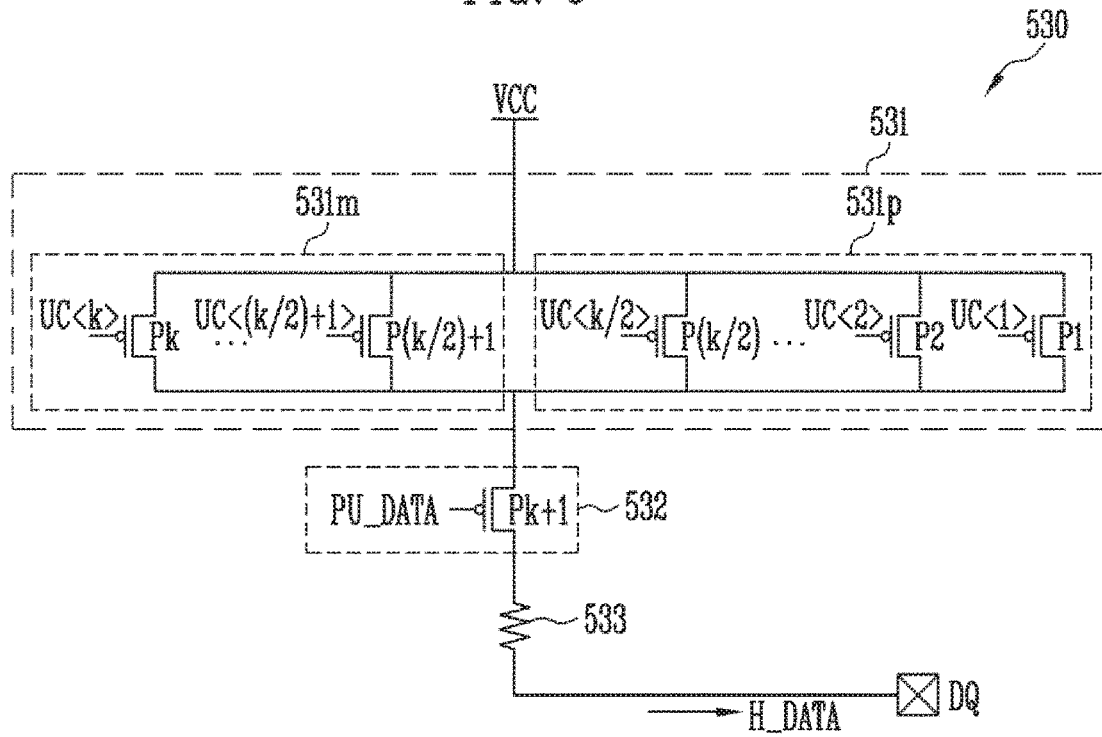
FIG. 6 is a diagram illustrating a pull-up main driver according to an embodiment of the present disclosure.

FIG. 6 is a diagram illustrating a pull-up main driver according to an embodiment of the present disclosure, for example, the pull-up main driver 530 of FIG. 3.

Referring to FIG. 6, the pull-up main driver 530 may include a sub pull-up circuit 531 and a main pull-up circuit 532. The sub pull-up circuit 531 and the main pull-up circuit 532 may be coupled in series to each other between a power voltage terminal VCC and the input/output pad DQ. For example, the sub pull-up circuit 531 may be coupled between the power voltage terminal VCC and the main pull-up circuit 532, and the main pull-up circuit 532 may be coupled between the sub pull-up circuit 531 and the input/output pad DQ. The sub pull-up circuit 531 may be directly coupled to the power voltage terminal VCC to perform an emphasis function for increasing a swing width of data to be outputted through the input/output pad DQ or de-emphasis function for decreasing a swing width of data. A resistor 533 may be further coupled between the main pull-up circuit 532 and the input/output pad DQ. In various embodiments, the resistor 533 includes multiple resistors. The size and number of resistors may vary depending on the data output buffer 500.

The sub pull-up circuit 531 may include a plurality of PMOS transistors P1 to Pk (where k is a positive integer). The PMOS transistors P1 to Pk may be coupled in parallel to each other between the power voltage terminal VCC and the main pull-up circuit 532. The PMOS transistors P1 to Pk may be turned on or turned off according to respective bits included in the up-code UC<k:1>. For example, when a first up-code UC<1> includes logic '0,' a first PMOS transistor P1 may be turned on. When the first up-code UC<1> includes logic '1,' the first PMOS transistor P1 may be turned off. When the number of turned-on PMOS transistors increases, the emphasis function for increasing a swing width of data to be outputted through the input/output pad DQ may be performed. When the number of turned-on PMOS transistors decreases, the de-emphasis function for decreasing a swing width of data to be outputted through the input/output pad DQ may be performed.

The PMOS transistors P1 to Pk may all have the same size or different sizes. For example, when the PMOS transistors P1 to Pk all have the same size, the number of turned-on PMOS transistors increases when the number of '0' bits included in the up-code UC<k:1> increases, and therefore, the amount of current may increase. On the contrary, when the PMOS transistors P1 to Pk all have the same size, the number of turned-on PMOS transistors decreases when the number of '0' bits included in the up-code UC<k:1> decreases, and therefore, the amount of current may decrease.

In another embodiment, the PMOS transistors P1 to Pk may be divided into a plurality of groups according to sizes thereof. For example, PMOS transistors P1 to P(k/2) having a first size may constitute a first sub pull-up group 531p, and PMOS transistors P(k/2)+1 to Pk having a second size constitute a second sub pull-up group 531m. Since the size of the PMOS transistors P(k/2)+1 to Pk included in the second sub pull-up group 531m is large, the PMOS transistors P(k/2)+1 to Pk included in the second sub pull-up group 531m may considerably correct the amount of current. Since the size of the PMOS transistors P1 to P(k/2) included in the first sub pull-up group 531p is relatively small, the PMOS transistors P1 to P(k/2) included in the first sub pull-up group 531p may slightly correct the amount of current. Thus, the amount of current can be minutely adjusted by adjusting the number of turned-on PMOS transistors among the PMOS transistors P1 to Pk included in the first and second sub pull-up groups 531p and 531m. Accordingly, the emphasis function for increasing a swing width of data to be outputted through the input/output pad DQ can be performed by controlling the PMOS transistors P1 to Pk included in the sub pull-up circuit 531.

The main pull-up circuit 532 may be implemented with a PMOS transistor Pk+1. The PMOS transistor Pk+1 may be turned on or turned off according to the pull-up data PU_DATA. For example, the PMOS transistor Pk+1 may be turned on when low pull-up data PU_DATA is received, while be turned off when high pull-up data PU_DATA is received.

When the pull-up data PU_DATA includes logic low, the pull-up main driver 530 is to transmit high data H_DATA to the input/output pad DQ, and hence the power voltage terminal VCC is to be coupled to the input/output pad DQ through the sub pull-up circuit 531 and the main pull-up circuit 532. Therefore, one or more PMOS transistors P1 to Pk included in the sub pull-up circuit 531 are to be turned on.

When the pull-up data PU_DATA includes logic high, the PMOS transistor Pk+1 included in the main pull-up circuit 532 is turned off, and hence the connection between the power voltage terminal VCC and the input/output pad DQ is blocked. The pull-up main driver 530 blocks the connection between the power voltage terminal VCC and the input/output pad DQ, regardless of the up-code UC<k:1>. However, the up-code UC<k:1> preferably includes all '1' bits to efficiently prevent leakage. When the up-code UC<k:1> is configured with all '1' bits, all of the PMOS transistors P1 to Pk included in the sub pull-up circuit 531 are turned off, and thus the leakage can be more efficiently prevented.

Figure 7:
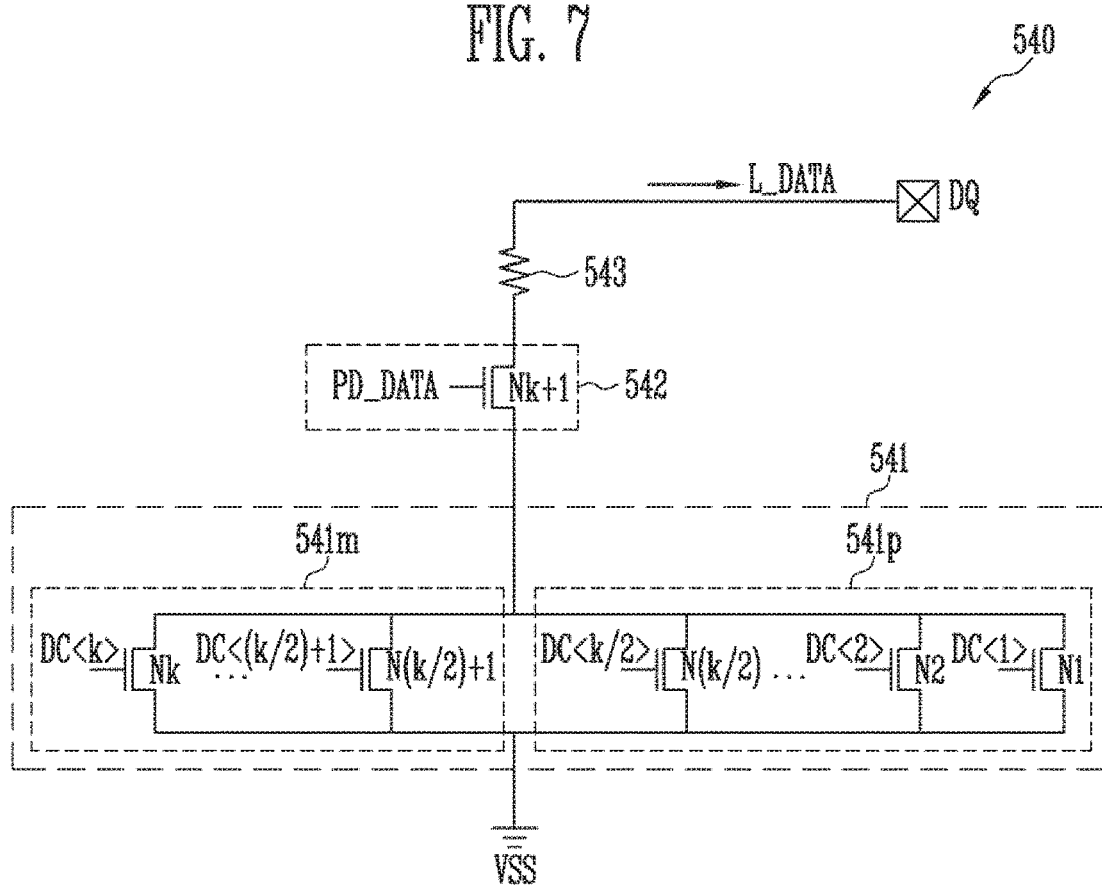
FIG. 7 is a diagram illustrating a pull-down main driver according to an embodiment of the present disclosure.

FIG. 7 is a diagram illustrating a pull-down main driver according to an embodiment of the present disclosure, for example, the pull-down main driver 540 of FIG. 3.

Referring to FIG. 7, the pull-down main driver 540 may include a sub pull-down circuit 541 and a main pull-down circuit 542. The sub pull-down circuit 541 and the main pull-down circuit 542 may be coupled in series to each other between the input/output pad DQ and a ground terminal VSS. For example, the sub pull-down circuit 541 may be coupled between the ground terminal VSS and the main pull-down circuit 542, and the main pull-down circuit 542 may be coupled between the sub pull-down circuit 541 and the input/output pad DQ. The sub pull-down circuit 541 may be directly coupled to the ground terminal VSS to perform an emphasis or de-emphasis function for data to be outputted through the input/output pad DQ. A resistor 543 may be further coupled between the main pull-down circuit 542 and the input/output pad DQ. In various embodiments, the resistor 533 include a plurality of resistors. The size and number of resistors may be changed depending on the data output buffer 500.

The sub pull-down circuit 541 may include a plurality of NMOS transistors N1 to Nk (where k is a positive integer). The NMOS transistors N1 to Nk may be coupled in parallel to each other between the ground terminal VSS and the main pull-down circuit 542. The NMOS transistors N1 to Nk may be turned on or turned off according to respective bits included in the down-code DC<k:1>. For example, when a first down-code DC<1> includes logic a first NMOS transistor N1 may be turned on. When the first down-code DC<1> includes logic '0,' the first NMOS transistor N1 may be turned off. When the number of turned-on NMOS transistors increases, the emphasis function for increasing a swing width of data to be outputted through the input/output pad DQ may be performed. When the number of turned-on NMOS transistors decreases, the de-emphasis function for decreasing a swing width of data to be outputted through the input/output pad DQ may be performed.

The NMOS transistors N1 to Nk may all have the same size or different sizes. For example, when the NMOS transistors N1 to Nk all have the same size, the number of turned-on NMOS transistors increases when the number of bits included in the down-code DC<k:1> increases, and therefore the amount of current may increase. On the contrary, when the NMOS transistors N1 to Nk all have the same size, the number of turned-on NMOS transistors decreases when the number of '1' bits included in the down-code DC<k:1> decreases, and therefore the amount of current may decrease.

In another embodiment, the NMOS transistors N1 to Nk may be divided into a plurality of groups according to sizes thereof. For example, NMOS transistors N1 to N(k/2) having a first size may constitute a first sub pull-down group 541p, and NMOS transistors N(k/2)+1 to Nk having a second size may constitute a second sub pull-down group 541m. Since the size of the NMOS transistors N(k/2)+1 to Nk included in the second sub pull-down group 541m is large, the NMOS transistors N(k/2)+1 to Nk included in the second sub pull-down group 541m may considerably correct the amount of current. Since the size of the NMOS transistors N1 to N(k/2) included in the first sub pull-down group 541p is relatively small, the NMOS transistors N1 to N(k/2) included in the first sub pull-down group 541p may slightly correct the amount of current. Thus, the amount of current can be minutely adjusted by adjusting the number of turned-on NMOS transistors among the NMOS transistors N1 to Nk included in the first and second sub pull-down groups 541p and 541m. Accordingly, the emphasis function for increasing a swing width of data to be outputted through the input/output pad DQ can be performed by controlling the NMOS transistors N1 to Nk included in the sub pull-down circuit 541.

The main pull-down circuit 542 may be implemented with an NMOS transistor Nk+1. The NMOS transistor Nk+1 may be turned on or turned off according to the pull-down data PD_DATA. For example, the NMOS transistor Nk+1 may be turned on when high pull-down data PD_DATA is received, while be turned off when low pull-down data PD_DATA is received.

When the pull-down data PD_DATA is high, the pull-down main driver 540 is to transmit low data L-DATA to the input/output pad DQ, and hence the input/output pad DQ is to be coupled to the ground terminal VSS through the sub pull-down circuit 541 and the main pull-down circuit 542. Therefore, one or more NMOS transistors N1 to Nk included in the sub pull-down circuit 541 are to be turned on.

When the pull-down data PD_DATA is low, the NMOS transistor Nk+1 included in the main pull-down circuit 542 is turned off, and hence the connection between the input/output pad DQ and the ground VSS terminal is blocked. The pull-down main driver 540 blocks the connection between the ground VSS terminal and the input/output pad DQ, regardless of the down-code DC<k:1>. However, the down-code DC<k:1> preferably includes all '0' bits so as to efficiently prevent leakage. When the down-code DC<k:1> is configured with all '0' bits, all of the NMOS transistors N1 to Nk included in the sub pull-down circuit 541 are turned off, and thus the leakage can be more efficiently prevented.

Figure 8:
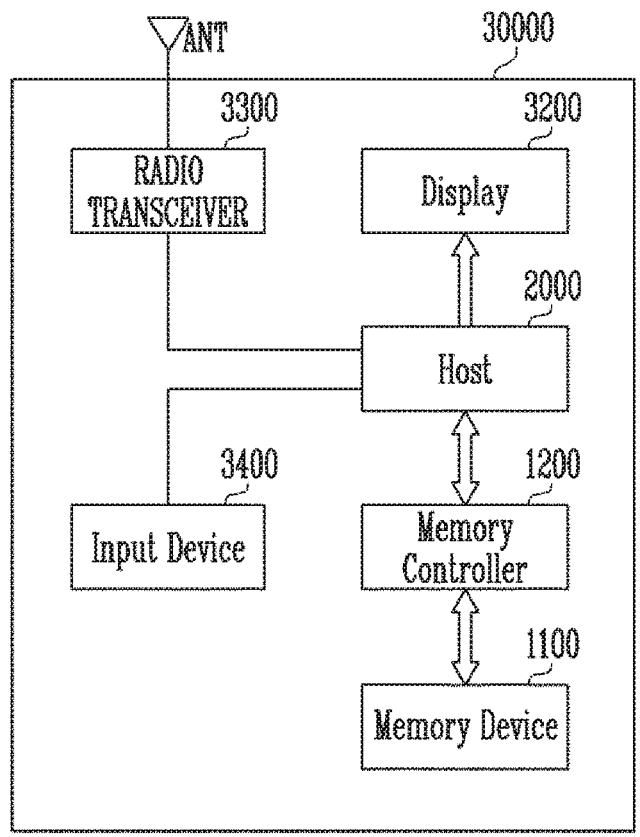
FIG. 8 is a diagram illustrating another embodiment of a memory system including a memory device.

FIG. 8 is a diagram illustrating an embodiment of a memory system including a memory device, for example, the memory device 1100 shown in FIG. 2.

Referring to FIG. 8, the memory system 30000 may be implemented as a cellular phone, a smart phone, a tablet PC, a personal digital assistant (PDA), or a wireless communication device.

The memory system 30000 may include the memory device 1100 and a memory controller 1200 capable of controlling an operation of the memory device 1100. The memory controller 1200 may control a data access operation of the memory device 1100, e.g., a program operation, an erase operation, a read operation, or the like under the control of a host 2000.

Data programmed in the memory device 1100 may be output through a display 3200 under the control of the memory controller 1200.

A radio transceiver 3300 may transmit and/or receive radio signals through an antenna ANT. For example, the radio transceiver 3300 may convert a radio signal received through the antenna ANT into a signal that can be processed by the host 2000. Therefore, the host 2000 may process a signal output from the radio transceiver 3300 and transmit the processed signal to the memory controller 1200 or the display 3200. The memory controller 1200 may transmit the signal processed by the host 2000 to the memory device 1100. Also, the radio transceiver 3300 may convert a signal output from the host 2000 into a radio signal, and output the converted radio signal to an external device through the antenna ANT. An input device 3400 is a device capable of inputting a control signal for controlling an operation of the host 2000 or data to be processed by the host 2000, and may be implemented as a pointing device such as a touch pad or a computer mount, a keypad, or a keyboard. The host 2000 may control an operation of the display 3200 such that data output from the memory controller 1200, data output from the radio transceiver 3300, or data output from the input device 3400 can be output through the display 3200.

Figure 9:
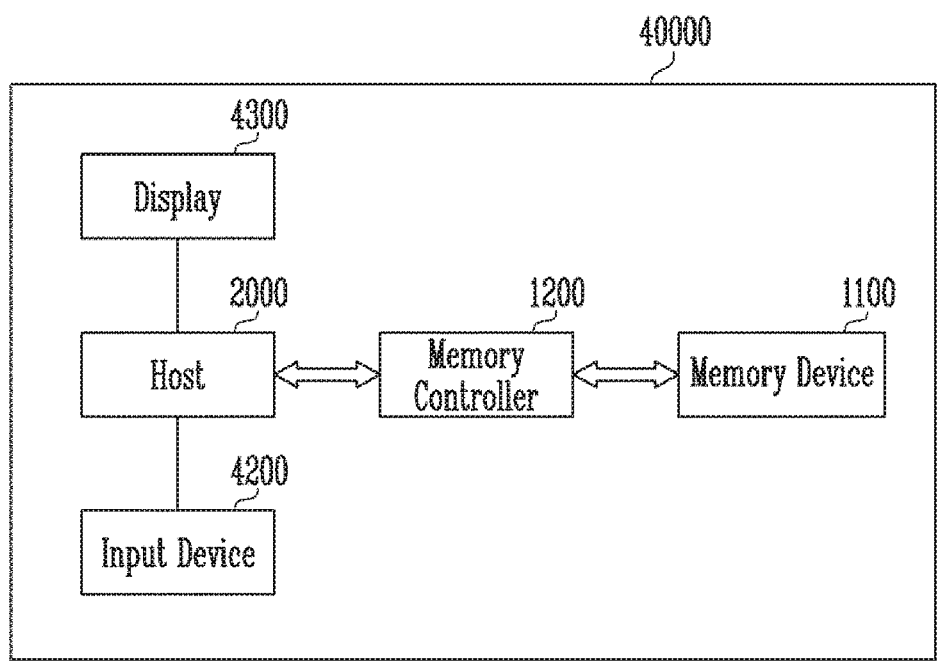
FIG. 9 is a diagram illustrating another embodiment of a memory system including a memory device.

FIG. 9 is a diagram illustrating an embodiment of a memory system including a memory device, for example, the memory device 1100 shown in FIG. 2.

Referring to FIG. 9, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling a data processing operation of the memory device 1100.

A host 2000 may output data stored in the memory device 1100 through a display 4300 according to data input through an input device 4200. For example, the input device 4200 may be implemented as a pointing device such as a touch pad or a computer mouse, a keypad, or a keyboard.

The host 2000 may control the overall operations of the memory system 40000, and control an operation of the memory controller 1200.

Figure 10:
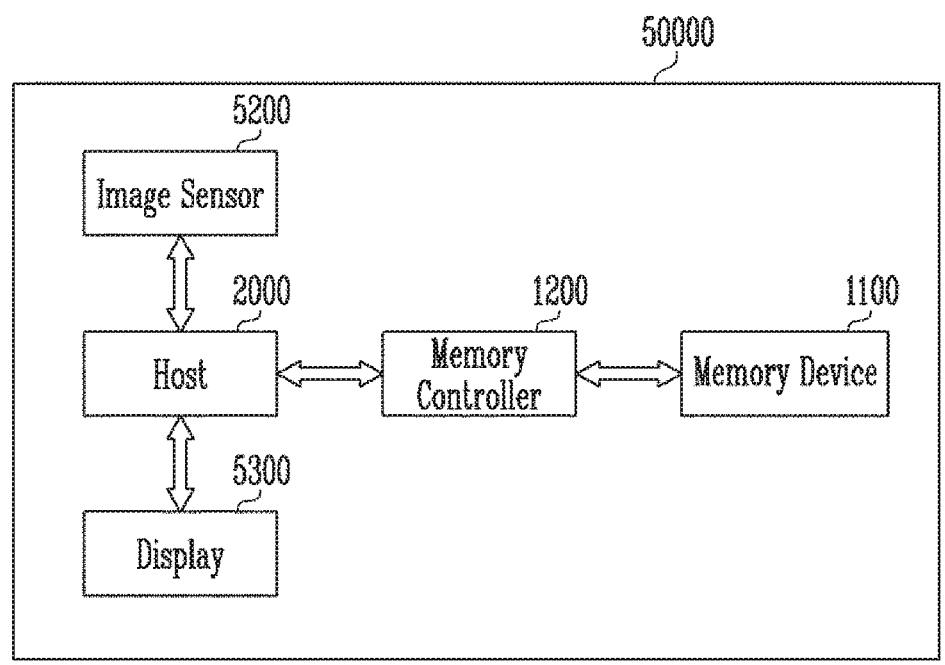
FIG. 10 is a diagram illustrating another embodiment of a memory system including a memory device.

FIG. 10 is a diagram illustrating an embodiment of a memory system including a memory device, for example, a memory device 1100 shown in FIG. 2.

Referring to FIG. 10, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include the memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a host 2000 or the memory controller 1200. Under the control of the host 2000, the converted digital signals may be output through a display 5300, or be stored in the memory device 1100 through the memory controller 1200. In addition, data stored in the memory device 1100 may be output through the display 5300 under the control of the host 2000.

Figure 11:
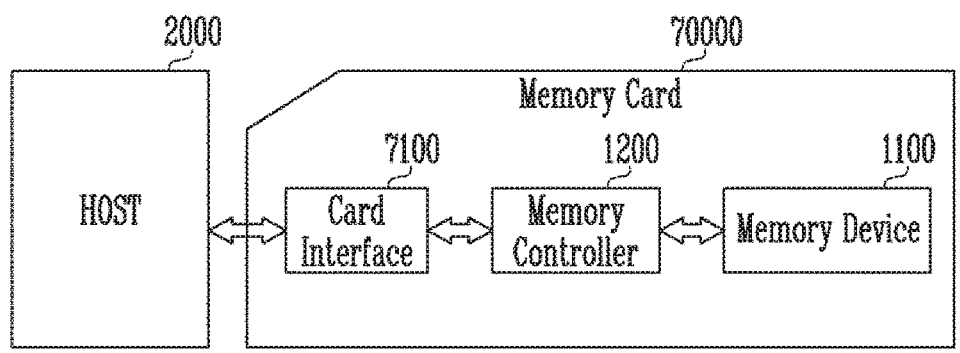
FIG. 11 is a diagram illustrating another embodiment of a memory system including a memory device.

FIG. 11 is a diagram illustrating another embodiment of a memory system including a memory device, for example, the memory device 1100 shown in FIG. 2.

Referring to FIG. 11, the memory system may include a host 2000 and a memory card 70000.

The memory card 70000 may be implemented with a smart card. The memory card 70000 may include the memory device 1100, a memory controller 1200, and a card interface 7100.

The memory controller 1200 may control data exchange between the memory device 1100 and the card interface 7100. In some embodiments, the card interface 7100 may be a Secure Digital (SD) card interface or a Multi-Media Card (MMC) interface, but the present disclosure is not limited thereto. Also, the card interface 7100 may interface data exchange between the host 2000 and the memory controller 1100 according to a protocol of the host 2000. In some embodiments, the card interface 7100 may support a Universal Serial Bus (USB) protocol and an Inter-Chip (IC)-USB protocol. The card interface 7100 may mean hardware capable of supporting a protocol used by the host 2000, software embedded in the hardware, or a signal transmission scheme.

According to the present disclosure, the data output buffer can perform the emphasis function for increasing a swing width of data to be outputted without increasing the capacitance of the input/output pad in a data output operation.

Further, according to the present disclosure, the data output buffer can perform the emphasis function without increasing the size of the data output buffer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A data output buffer comprising:
   a pull-up pre driver configured to output pull-up data by reversing received data, and output up-code for adjusting a swing width of the received data;
   a pull-down pre driver configured to output pull-down data by reversing the received data, and output a down-code for adjusting the swing width of the received data;
   a pull-up main driver configured to output first data having a value of logic high according to the pull-up data, and adjust a swing width of the first data according to the up-code; and
   a pull-down main driver configured to output second data having a value of logic low according to pull-down data, and adjust a swing width of the second data according to the down-code.

2. The data output buffer of claim 1, wherein the pull-up pre driver includes:
   a pull-up reverse circuit configured to reverse the received data and output the reversed data as the pull-up data; and
   a pull-up code generator configured to output the up-code according to the swing width of the received data.

3. The data output buffer of claim 2, wherein the pull-up reverse circuit outputs the pull-up data by reflecting the swing width of the received data as it is.

4. The data output buffer of claim 2, wherein the pull-up code generator:
   outputs the up-code for increasing the swing width of the received data when the swing width is smaller than a reference width; and
   outputs the up-code for decreasing the swing width of the received data when the swing width is larger than the reference width.

5. The data output buffer of claim 4, wherein the pull-up code generator adjusts the number of bits having a value of logic low and bits having a value of logic high included in the up-code according to the difference between the swing width of the received data and the reference width.

6. The data output buffer of claim 1, wherein the pull-down pre driver includes:

a pull-down reverse circuit configured to reverse the received data and output the reversed data as the pull-down data; and a pull-down code generator configured to output the down-code according to the swing width of the received data.

7. The data output buffer of claim 6, wherein the pull-down reverse circuit outputs the pull-down data by reflecting the swing width of the received data as it is.

8. The data output buffer of claim 6, wherein the pull-down code generator:
outputs the down-code for increasing the swing width of the received data when the swing width is smaller than a reference width; and
outputs the down-code for decreasing the swing width of the received data when the swing width is larger than the reference width.

9. The data output buffer of claim 8, wherein the pull-down code generator adjusts the number of bits having a value of logic low and bits having a value of logic high included in the down-code according to the difference between the swing width of the received data and the reference width.

10. The data output buffer of claim 1, wherein the pull-up main driver includes:
a sub pull-up circuit directly coupled to a power voltage terminal, the sub pull-up circuit performing an emphasis or de-emphasis function for the first data according to the up-code; and
a main pull-up circuit configured to couple the power voltage terminal to an input/output pad through the sub pull-up circuit according to the pull-up data.

11. The data output buffer of claim 10, wherein the sub pull-up circuit includes a plurality of transistors coupled in parallel to each other between the power voltage terminal and the main pull-up circuit.

12. The data output buffer of claim 11, wherein the transistors may be turned on or turned off according to the up-code.

13. The data output buffer of claim 11, wherein the transistors are implemented with transistors having the same size, or are implemented with transistors having different sizes.

14. The data output buffer of claim 10, wherein the main pull-up circuit is implemented with a transistor turned on or turned off according to the pull-up data.

15. The data output buffer of claim 10, further comprising at least one resistor coupled between the main pull-up circuit and the input/output pad.

16. The data output buffer of claim 1, wherein the pull-down main driver includes:
a sub pull-down circuit directly coupled to a ground terminal, the sub pull-down circuit performing an emphasis or de-emphasis function for the second data according to the down-code; and
a main pull-down circuit configured to couple the ground terminal to the input/output pad through the sub pull-down circuit according to the pull-down data.

17. The data output buffer of claim 16, wherein the sub pull-down circuit includes a plurality of transistors coupled in parallel to each other between the ground terminal and the main pull-down circuit.

18. The data output buffer of claim 17, wherein the transistors are turned on or turned off according to the down-code.

19. The data output buffer of claim 17, wherein the transistors are implemented with transistors having the same size, or are implemented with transistors having different sizes.

20. The data output buffer of claim 16, wherein the main pull-down circuit is implemented with a transistor turned on or turned off according to the pull-down data.

21. The data output buffer of claim 16, further comprising at least one resistor coupled between the main pull-down circuit and the input/output pad.

22. A data output buffer comprising:
a sub pull-up circuit configured to include a plurality of transistors coupled in parallel to a power voltage terminal, and perform an emphasis or de-emphasis function for data to be outputted in response to a received up-code; and
a main pull-up circuit configured to be coupled between the sub pull-up circuit and an input/output pad, and transfer the data outputted from the sub pull-up circuit to the input/output pad in response to pull-up data,
wherein the sub pull-up circuit and the main pull-up circuit are coupled in series between the power voltage terminal and the input/output pad.

23. The data output buffer of claim 22, wherein the transistors included in the sub pull-up circuit include a plurality of PMOS transistors coupled in parallel to each other between the power voltage terminal and the main pull-up circuit.

24. The data output buffer of claim 23, wherein the PMOS transistors are turned on or turned off according to the up-code.

25. The data output buffer of claim 23, wherein the PMOS transistors are implemented with transistors having the same size, or are implemented with transistors having different sizes.

26. The data output buffer of claim 22, wherein the up-code includes a combination of bits having a value of logic low and bits having a value of logic high, includes bits having a value of logic low, or includes bits having a value of logic high.

27. The data output buffer of claim 22, wherein the main pull-up circuit is implemented with a transistor turned on or turned off according to the pull-up data.

28. The data output buffer of claim 22, further comprising at least one resistor coupled between the main pull-up circuit and the input/output pad.

* * * * *